(12) United States Patent
Tsuchimochi (10) Patent No.: US 12,125,823 B2
(45) Date of Patent: Oct. 22, 2024

(54) SEMICONDUCTOR DEVICE INCLUDING INNER CONDUCTIVE LAYER HAVING REGIONS OF DIFFERENT SURFACE ROUGHNESS

(71) Applicant: DENSO CORPORATION, Kariya (JP)

(72) Inventor: Shingo Tsuchimochi, Kariya (JP)

(73) Assignee: DENSO CORPORATION, Kariya (JP)

( * ) Notice: Subject to any disclaimer, the term of this patent is extended or adjusted under 35 U.S.C. 154(b) by 414 days.

(21) Appl. No.: 17/691,237

(22) Filed: Mar. 10, 2022

(65) Prior Publication Data

US 2022/0199578 A1    Jun. 23, 2022

Related U.S. Application Data

(63) Continuation of application No. PCT/JP2019/036243, filed on Sep. 13, 2019.

(51) Int. Cl.
| | |
|---|---|
| *H01L 25/065* | (2023.01) |
| *H01L 23/00* | (2006.01) |
| *H01L 23/367* | (2006.01) |
| *H01L 23/498* | (2006.01) |
| *H01L 27/07* | (2006.01) |

(52) U.S. Cl.
CPC ...... *H01L 25/0655* (2013.01); *H01L 23/3675* (2013.01); *H01L 23/49822* (2013.01); *H01L 23/49833* (2013.01); *H01L 23/49838* (2013.01); *H01L 24/32* (2013.01); *H01L 27/0727* (2013.01); *H01L 2224/32225* (2013.01); *H01L 2924/1811* (2013.01); *H01L 2924/1815* (2013.01); *H01L 2924/182* (2013.01)

(58) Field of Classification Search
CPC .......................... H01L 23/49838; H01L 24/32
USPC ......................................................... 257/678
See application file for complete search history.

(56) References Cited

U.S. PATENT DOCUMENTS

| | | | |
|---|---|---|---|
| 10,727,150 B2 * | 7/2020 | Murakami | H01L 23/04 |
| 2013/0313711 A1 * | 11/2013 | Kumagai | H01L 24/32 |
| | | | 257/772 |

FOREIGN PATENT DOCUMENTS

| | | | | |
|---|---|---|---|---|
| JP | 2008-166626 A | | 7/2008 | |
| WO | WO-2012096066 A1 * | | 7/2012 | H01L 23/49833 |

* cited by examiner

*Primary Examiner* — Matthew E. Gordon
(74) *Attorney, Agent, or Firm* — Posz Law Group, PLC

(57) ABSTRACT

A semiconductor device includes a first insulating substrate and a first semiconductor element joined to the first insulating substrate through the first conductive spacer. The first insulating substrate includes a first insulating layer and a first inner conductive layer disposed at a side of the first insulating layer. The first inner conductive layer includes a surface having a first region and a second region. The second region surrounds the first region and has larger surface roughness than the first region. The first conductive spacer is joined to the first region of the first inner conductive layer through a first junction layer.

15 Claims, 6 Drawing Sheets

SEMICONDUCTOR DEVICE INCLUDING INNER CONDUCTIVE LAYER HAVING REGIONS OF DIFFERENT SURFACE ROUGHNESS

CROSS REFERENCE TO RELATED APPLICATION

The present application is a continuation application of International Patent Application No. PCT/JP2019/036243 filed on Sep. 13, 2019, which designated the U.S. The entire disclosure of the above application is incorporated herein by reference.

TECHNICAL FIELD

The present disclosure relates to a semiconductor device.

BACKGROUND

A semiconductor device may include a semiconductor element and a pair of conductive plates facing each other.

SUMMARY

The present disclosure describes a semiconductor device including a first insulating substrate and a first semiconductor element joined to the first insulating substrate with a first conductive spacer being interposed between the first insulating substrate and the first semiconductor element.

BRIEF DESCRIPTION OF DRAWINGS

The objects, features and advantages of the present disclosure will become more apparent from the following detailed description made with reference to the accompanying drawings. In the drawings.

DETAILED DESCRIPTION

A semiconductor element may be interposed between a pair of conductive plates in a semiconductor device. A conductive spacer may be inserted between one of the conductive plates and the semiconductor element. The conductive spacer may be joined to the conductive plate through a solder layer. A groove may be provided at the conductive plate to surround the solder layer. The groove may prevent excessive spread of wetting of the molten solder when soldering is performed between the conductive spacer and the conductive plate.

For such a semiconductor device described above, an insulating substrate may be adopted in at least one of the conductive plates. The insulating substrate refers to a substrate for a power circuit in which a conductive layer, for example, a metal plate is provided at one or both surfaces of an insulating layer such as a ceramic substrate. Typical examples of the insulating substrate include, for example, a Direct Bonded Copper (DBC) substrate, a Direct Bonded Aluminum (DBA) substrate and an Active Metal Brazed Copper (AMB) substrate, but the insulating substrate is not limited to these examples. It is possible to maintain the heat dissipation property of the semiconductor device while enhancing the insulating property by adopting the insulating substrate. However, the conductive layer of the insulating substrate is relatively thin. Therefore, it may be difficult for providing the groove described above at the conductive layer of the insulating substrate. It may be required to control the spread of wetting of joint material such as solder material in the conductive layer of the insulating substrate.

A semiconductor device disclosed in the present description includes a first insulating substrate and a first semiconductor element joined to the first insulating substrate through a first conductive spacer. The first insulating substrate includes a first insulating layer and a first inner conductive layer disposed at a side of the first insulating layer. The first inner conductive layer includes a surface having a first region and a second region. The second region surrounds the first region and has larger surface roughness than the first region. The first conductive spacer is joined to the first region of the first inner conductive layer through a first junction layer.

In the semiconductor device, the first region and the second region, which has larger surface roughness than the first region, are disposed at the surface of the first inner conductive layer, and the first region is surrounded by the second region. The first region having relatively low surface roughness has relatively high wettability for the molten joint material. In contrast, the second region has relatively large surface roughness has relatively low wettability for the molten joint material. When the first conductive spacer is joined to the first region by adopting the joint material such as solder material, the molten joint material has enhanced spread of wetting in the first region, and the spread of wetting is inhibited to the second region. Therefore, it is possible to intendedly control the spread of wetting in the joint material at the first inner conductive layer by properly designing the boundary between the first region and the second region.

In an embodiment of the present disclosure, the area of a first region of a first inner conductive layer may be larger than the area of a surface of a first conductive spacer facing the first region of the first inner conductive layer. According to such a configuration, when a first junction layer is in contact with the first region over a sufficient area, a first conductive block and the first inner conductive layer are strongly joined to each other. In particular, in a step of roughening a second region, foreign substances scattered from the second region are adhered to the first region. Even in such a case, when the first region is set to be wider than the size of the first conductive spacer, it is possible to suppress a decrease in joining force exerted by the foreign substances.

In the embodiment, the area where the first junction layer is in contact with the first inner conductive layer may be larger than the area where the first junction layer is in contact with the surface of the first conductive spacer. According to such a configuration, since the first junction layer has a suitable fillet shape, the thermal stress generated inside the semiconductor device, in particular, the first junction layer and its surrounding is suppressed. However, in another embodiment, the area where the first junction layer is in contact with the first inner conductive layer may be smaller than the area where the first junction layer is in contact with the surface of the first conductive spacer.

In the embodiment of the present disclosure, the first junction layer may reach at least one portion of the boundary between the first region and the second region at a surface of the first inner conductive layer. With such a configuration, it can be determined that the size of the first region is substantially appropriate for the size of the first conductive spacer. However, in another embodiment, the first region may be designed to be sufficiently larger than the size of the first conductive spacer. As a result, the first junction layer may not be required to reach the boundary between the first region and the second region.

In the embodiment, the first junction layer may cover over the entire first region on the surface of the first inner conductor layer. With such a configuration, it is considered that the size of the first region is more appropriate for the size of the first conductive spacer, and it can be determined that the spread of wetting of the first junction layer is accurately controlled by the second region.

In the embodiment, the first junction layer may extend to the second region at the surface of the first inner conductive layer, and may not be needed to extend to the second region. That is, the second region may completely inhibit the spread of wetting of the molten joint material, and may merely suppress the spread of wetting of the molten joint material.

In the embodiment, the first junction layer may include solder material. However, the material included in the first junction layer is not only limited to the solder material, but may also be conductive joint material other than the solder material.

In the embodiment of the present disclosure, the first insulating substrate may further include a first outer conductive layer at the other side of the first insulating layer, in other words, at a side opposed to the first inner conductive layer. According to such a configuration, it is possible to enhance the heat dissipation property of the first insulating substrate. When the symmetry of the structure of the both sides of the first insulating layer is enhanced, it is possible to suppress the warp due to the thermal deformation of the first insulating substrate. In this respect, the first inner conductive layer and the first outer conductive layer are not particularly limited. However, they may be formed with the mutually identical patterns.

In the embodiment of the present disclosure, the semiconductor device may further include a sealer for sealing the first semiconductor element. In this case, the sealer may be in contact with the second region of the first inner conductive layer. Since the second region of the first inner conductive layer has relatively large surface roughness, it is possible to adhere to the sealer by, for example, an anchor effect. When the semiconductor device includes the sealer, the second region of the first inner conductive layer does not only control the spread of wetting of the joint material, but also can enhance the sealing property of the first semiconductor element through the sealer.

In the embodiment of the present disclosure, the second region of the first inner conductive layer may be a region roughened by at least one of laser irradiation, electron beam irradiation, sputtering, chemical etching and short blasting. According to such a configuration, it is possible to uniformly form the second region at the surface of the first inner conductive layer. The second region has minute roughness. The surface roughness of the second region is not particularly limited. As described above, the wettability for the molten joint material, in other words, the material included in the first junction layer may be lower in the second region than in the first region. In other words, the contact angle at the second region of the molten joint material may be smaller than the contact angle at the first region. For example, the contact angle at the second region may be 90 degrees or larger, whereas the contact angle at the first region is less than 90 degrees.

In the embodiment of the present disclosure, the semiconductor device may further include a second insulating substrate facing the first insulating substrate through the first semiconductor element. In this case, the second insulating substrate may include a second insulating layer, a second inner conductive layer disposed at one side of the second insulating layer. The surface of the second inner conductive layer may include a third region and a fourth region. The fourth region has larger surface roughness than the third region and surrounds the third region. The first semiconductor element may be joined to the third region of the second inner conductive layer through the second junction layer. In a case where the semiconductor device further includes the second insulating substrate, it is possible to similarly adopt the configuration of the first insulating substrate for the second insulating substrate.

In the embodiment of the present disclosure, the second insulating substrate may further include a second outer conductive layer disposed at the other side of the second insulating layer. According to such a configuration, as similar to the first insulating substrate described above, it is possible to enhance the heat dissipation property of the second insulating substrate and suppress the warp caused by the thermal deformation of the second insulating substrate.

In the embodiment of the present disclosure, the semiconductor device may further include a second semiconductor element joined to the first insulating substrate through a second conductive spacer. In this case, the first inner conductive layer of the first insulating substrate may include a fifth region and a sixth region. The sixth region has larger surface roughness than the fifth region and surrounds the fifth region. The second conductive spacer may be joined to the fifth region of the first inner conductive layer through the third junction layer. The fifth region may be separated from the first region, or may be continuous with the first region. The fifth region may be separated from the first region, or may be continuous with the first region.

In the embodiment, the first inner conductive layer of the first insulating substrate may have a first portion and a second portion separated from each other above the first insulating layer. In this case, the first region and the second region may be located at the first portion of the first inner conductive layer, and the fifth region and the sixth region may be located at the second portion of the first inner conductive layer. According to such a configuration, the first semiconductor element and the second semiconductor element can be electrically insulated at the common first insulating substrate.

In the embodiment of the present disclosure, the semiconductor device may further include the second insulating substrate facing the first insulating substrate through the second semiconductor element. In this case, the second insulating substrate may include a second insulating layer, a second inner conductive layer disposed at one side of the second insulating layer. The surface of the second inner conductive layer may include a seventh region and an eighth region. The eighth region has larger surface roughness than the seventh region and surrounds the seventh region. The second semiconductor element may be joined to the seventh region of the second inner conductive layer through the fourth junction layer. With regard to the second semiconductor element, it is possible to similarly adopt the configuration of the first insulating substrate for the second insulating substrate.

In the embodiment of the present disclosure, the first semiconductor element and/or the second semiconductor element may be a switching element having an upper surface electrode and a lower surface electrode. The switching element conducts or blocks electricity between the upper surface electrode and the lower surface electrode. In this case, the switching element may be an Insulated Gate Bipolar Transistor (IGBT) or a Metal-Oxide-Semiconductor Field-Effect Transistor (MOSFET), but is not limited to these examples.

Embodiment

A semiconductor device 10 according to the embodiment is described with reference to drawings. The semiconductor device 10 is adopted in, for example, a power control device for an electric vehicle, and can form a part of a power conversion circuit such as a converter or an inverter. The electric vehicle herein broadly means a vehicle having a motor for driving wheels, and for example, an electric vehicle charged by an external electric power, a hybrid vehicle having an engine in addition to the motor, a fuel cell vehicle having a fuel cell as the power source and the like.

As shown in FIGS. 1 to 6, the semiconductor device 10 includes a first semiconductor element 12, a second semiconductor element 14, and a sealer 52. The first semiconductor element 12 and the second semiconductor element 14 are sealed inside the sealer 52. The sealer 52 includes insulating material. Although not particularly limited, the sealer 52 in the present embodiment includes thermosetting resin such as epoxy resin. The sealer 52 has a plate-like shape. The sealer 52 has an upper surface 52a and a lower surface 52b. The lower surface 52b is located at a side opposed to the upper surface 52a The first semiconductor element 12 includes a semiconductor substrate 12a, an upper surface electrode 12b, a lower surface electrode 12c and signal electrodes 12d. The upper surface electrodes 12b and the signal electrodes 12d are located at the upper surface of the semiconductor substrate 12a, and the lower surface electrode 12c is located at the lower surface of the semiconductor substrate 12a. Although not particularly limited, the first semiconductor element 12 is a switching element that conducts and blocks the electricity between the upper surface electrode 12b and the lower surface electrode 12c, and is specifically an RC-IGBT. That is, the first semiconductor element 12 has a built-in freewheeling diode in addition to the IGBT. As another embodiment, the first semiconductor device 12 may be a MOSFET.

Similarly, the second semiconductor element 14 includes a semiconductor substrate 14a, an upper surface electrode 14b, a lower surface electrode 14c and multiple signal electrodes 14d. The upper surface electrodes 14b and the signal electrodes 14d are located at the upper surface of the semiconductor substrate 14a, and the lower surface electrode 14c is located at the lower surface of the semiconductor substrate 14a. Although not particularly limited, the second semiconductor element 14 is a switching element that conducts and blocks the electricity between the upper surface electrode 14b and the lower surface electrode 14c, and is specifically an RC-IGBT. That is, the second semiconductor element 14 has a built-in freewheeling diode in addition to the IGBT. As another embodiment, the first semiconductor device 14 may be a MOSFET.

Although not particularly limited, semiconductor elements having the identical structure are adopted in the first semiconductor element 12 and the second semiconductor element 14. However, as another embodiment, semiconductor elements having different structures may be respectively adopted for the first semiconductor element 12 and the second semiconductor element 14. For example, switching elements having different structures can be respectively adopted for the first semiconductor element 12 and the second semiconductor element 14. Alternatively, the first semiconductor element 12 may be a switching element, and the second semiconductor element 14 may be a diode element. The first semiconductor element 12 and the second semiconductor element 14 are not only limited to the switching elements, but also a variety kinds of the power semiconductor element can be adopted. Although the semiconductor substrate 12a of the first semiconductor element 12 and the semiconductor substrate 14a of the second semiconductor element 14 are not particularly limited, each of the semiconductor substrate 12a and the semiconductor substrate 14a may be, for example, a silicon substrate, a silicon carbide substrate or a nitride semiconductor substrate.

The semiconductor device 10 further includes a first insulating substrate 20 and a second insulating substrate 30. The first insulating substrate 20 faces the second insulating substrate 30 through the first semiconductor element 12 and the second semiconductor element 14. The first insulating substrate 20 and the second insulating substrate 30 are integrally held by the sealer 52, and the space between the first insulating substrate 20 and the second insulating substrate 30 is filled by the sealer 52. The first insulating substrate 20 is not limited to a single insulating substrate, and may include two or more insulating substrates. The second insulating substrate 30 is not limited to a single insulating substrate, and may include two or more insulating substrates.

The first insulating substrate 20 includes a first insulating layer 22, a first inner conductive layer 24 and a first outer conductive layer 26. The first inner conductive layer 24 is disposed at one side of the first insulating layer 22, and the first outer conductive layer 26 is disposed at the other one side of the first insulating layer 22. The first inner semiconductor layer 24 is electrically connected to the first semiconductor element 12 and the second semiconductor element 14 inside the sealer 52. On the other hand, the first outer conductive layer 26 is exposed outward at an upper surface 52a of the sealer 52. Therefore, the first insulating substrate 20 is not only included in a part of an electric circuit, the first insulating substrate 20 also functions as a heat radiation plate that emits the heat of the first semiconductor element 12 and the second semiconductor element 14 outwards.

The first inner conductive layer 24 of the first insulating substrate 20 includes a first portion 24X and a second portion 24Y. The first portion 24X and the second portion 24Y are separated from each other, and are electrically insulated above the first insulating layer 22. The first portion 24X of the first inner conductive layer 24 are electrically connected to the upper surface electrode 12b of the first semiconductor element 12 through a first conductive spacer 16. Specifically, the first portion 24X of the first inner conductive layer 24 is joined to the first conductive spacer 16 through a junction layer 60A, and the first conductive spacer 16 is joined to the upper surface electrode 12*b* of the first semiconductor element 12 through a junction layer 60B. On the other hand, the second portion 24Y of the first inner conductive layer 24 is electrically connected to the upper electrode 14*b* of the second semiconductor element 14 through a second conductive spacer 18. Specifically, the second portion 24Y of the first inner conductive layer 24 is joined to the second conductive spacer 18 through a junction layer 60D, and the second conductive spacer 18 is joined to the upper surface electrode 14*b* of the second semiconductor element 14 through a junction layer 60E. Although the junction layers 60A, 60B, 60C, 60D are not particularly limited, they may include solder material.

The first outer conductive layer 26 of the first insulating substrate 20 includes a first portion 26X and a second portion 26Y. The first portion 26X of the first outer conductive layer 26 and the first portion 24X of the first inner conductive layer 24 have identical shapes, and both of the first portions 26X, 24X face each other with the first insulating layer 22 being interposed between both of the first portions 26X, 24X. Similarly, the second portion 26Y of the first outer conductive layer 26 and the second portion 24Y of the first inner conductive layer 24 have identical shapes, and both of the second portions 26Y, 24Y face each other with the first insulating layer 22 being interposed between both of the second portions 26Y, 24Y. As described above, when the first insulating substrate 20 has a symmetrical structure at both sides of the first insulating layer 22, the warpage due to thermal deformation of the first insulating substrate 20 is effectively suppressed. However, as another embodiment, the first outer conductive layer 26 of the first insulating substrate 20 may not needed to be divided into portions 26X, 26Y. The first outer conductive layer may include a single portion.

The second insulating substrate 30 includes a second insulating layer 32, a second inner conductive layer 34 and a second outer conductive layer 36. The second inner conductive layer 34 is disposed at one side of the second insulating layer 32, and the second outer conductive layer 36 is disposed at the other one side of the second insulating layer 32. The second inner semiconductor layer 34 is electrically connected to the first semiconductor element 12 and the second semiconductor element 14 inside the sealer 52. On the other hand, the second outer conductive layer 36 is exposed outward at a lower surface 52*b* of the sealer 52. Therefore, the second insulating substrate 30 is not only included in a part of an electric circuit, the second insulating substrate 30 also functions as a heat radiation plate that emits the heat of the first semiconductor element 12 and the second semiconductor element 14 outwards.

The second inner conductive layer 34 of the second insulating substrate 30 includes a first portion 34X, a second portion 34Y and a third portion 34Z. The first portion 34X, the second portion 34Y and the third portion 34Z are separated from each other, and are electrically insulated above the second insulating layer 32. The first portion 34X of the second inner conductive layer 34 is joined to the lower surface electrode 12*c* of the first semiconductor element 12 through the junction layer 60C, and is electrically connected to the lower surface electrode 14*c*. On the other hand, the second portion 34Y of the second inner conductive layer 34 is joined to the lower surface electrode 14*c* of the second semiconductor element 14 through the junction layer 60F, and is electrically connected to the lower surface electrode 14*c*. Although the junction layers 60E, 60F are not particularly limited, they may include solder material.

The second outer conductive layer 36 of the second insulating substrate 30 includes a first portion 36X, a second portion 36Y, and a third portion 36Z. The first portion 36X of the second outer conductive layer 36 and the first portion 34X of the second inner conductive layer 34 have identical shapes, and both of the first portions 34X, 36X face each other with the second insulating layer 32 being interposed between both of the first portions 34X, 36X. Similarly, the second portion 26Y of the second outer conductive layer 36 and the second portion 34Y of the second inner conductive layer 34 have identical shapes, and both of the second portions 34Y, 36Y face each other with the second insulating layer 32 being interposed between both of the second portions 34Y, 36Y. Similarly, the third portion 36Z of the second outer conductive layer 36 and the third portion 34Z of the second inner conductive layer 34 have identical shapes, and both of the third portions 34Z, 36Z face each other with the second insulating layer 32 being interposed between both of the third portions 34Z, 36Z. As described above, when the second insulating substrate 30 has a symmetrical structure at both sides of the second insulating layer 32, the warpage due to thermal deformation of the second insulating substrate 30 is effectively suppressed. However, as another embodiment, the second outer conductive layer 36 of the second insulating substrate 30 may not needed to be divided into portions 36X, 36Y, 36Z. The second outer conductive layer 36 may include a single portion.

As one of several examples, each of the first insulating substrate 20 and the second insulating substrate 30 in the present embodiment is an Active Metal Brazed Copper (AMB) substrate. Each of the first insulating layer 22 and the second insulating layer 32 is made of ceramic such as aluminum oxide, silicon nitride and aluminum nitride. On the other hand, the first inner conductive layer 24, the second inner conductive layer 34, the first outer conductive layer 26 and the second outer conductive layer 36 are made of copper. The respective surfaces of the first inner conductive layer 24 and the second inner conductive layer 34 are nickel-plated and gold-plated. However, each of the first insulating substrate 20 and the second insulating substrate 30 is not only limited to the AMB substrate, but may also be a Direct Bonded Copper (DBC) substrate or a Direct Bonded Aluminum (DBA) substrate. The specific configuration of each of the first insulating substrate 20 and the second insulating substrate 30 is not particularly limited. The first insulating substrate 20 and the second insulating substrate 30 may respectively include at least the first insulating layer 22, the second insulating layer 32, the first conductive layer 24 and the second conductive layer 34, but may not require to respectively have the first outer conductive layer 26 and the second outer conductive layer 36.

The semiconductor device 10 further includes a connecting member 40. The connecting member 40 is located inside the sealer 52 between the first insulating substrate 20 and the second insulating substrate 30. The upper surface of the connecting member 40 is joined to the first portion 24X of the first inner conductive layer 24 through a junction layer 60G. The lower surface of the connecting member 40 is joined to the second portion 34Y of the second inner conductive layer 34. The connecting member 40 is made of metal such as copper or a conductor other than the metal, and electrically connects the first portion 24X of the first inner conductive layer 24 and the second portion 34Y of the second inner conductive layer 34. The first semiconductor element 12 and the second semiconductor element 14 are electrically connected in series inside the sealer 52.

The semiconductor device 10 further includes a first power terminal 42, a second power terminal 44, and a third power terminal 46. The first power terminal 42, the second power terminal 44 and the third power terminal 46 respectively protrude in the identical direction from the sealer 52, and extend in parallel with each other. The first power terminal 42, the second power terminal 44 and the third power terminal 46 are made of a conductor such as copper or other metal. Although not particularly limited, in the manufacturing stage of the semiconductor device 10, the first power terminal 42, the second power terminal 44 and the third power terminal 46 may be prepared by a single lead frame together with a first signal terminal 48 and a second signal terminal 50 described in the following.

The first power terminal 42 is joined to the second insulating substrate 30 inside the sealing body 52. Specifically, the first power terminal 42 is joined to the first portion 34X of the second inner conductive layer 34 through a junction layer (not shown). As a result, the first power terminal 42 is electrically connected to the lower surface electrode 12c of the first semiconductor element 12. The second power terminal 44 is joined to the first insulating substrate 20 inside the sealer 52. Specifically, the second power terminal 44 is joined to the second portion 24Y of the first inner conductive layer 24 through a junction layer 60I. As a result, the second power terminal 44 is electrically connected to the upper surface electrode 12b of the second semiconductor element 14. The third power terminal 46 is joined to the second insulating substrate 30 inside the sealer 52. Specifically, the third power terminal 46 is joined to the second portion 34Y of the second inner conductive layer 34 through a junction layer (not shown). As a result, the third power terminal 46 is electrically connected to the upper surface electrode 12b of the first semiconductor element 12 and the lower surface electrode 14c of the second semiconductor element 14.

The semiconductor device 10 includes multiple first signal terminals 48 and multiple second signal terminals 50. The first signal terminals 48 and the second signal terminals 50 respectively protrude in the identical direction from the sealer 52, and extend in parallel with each other. Each of the first signal terminals 48 and the second signal terminals 50 is made of a conductor such as copper or other metal. The first signal terminals 48 are respectively connected to signal electrodes 12d of the first semiconductor element 12 inside the sealer 52. The second signal terminals 50 are respectively electrically connected to signal electrodes 14d inside the sealer 52. Although not particularly limited, each of the first signal terminals 48 and the second signal terminals 50 in the present embodiment are respectively connected to corresponding signal electrodes 12d through a bonding wire (not shown) made of metal such as aluminum or copper. However, the connection between the corresponding one of the signal terminals 48, 50 and the corresponding one of the signal electrodes 12d, 14d is not only limited to the bonding wire, but may also adopt the first inner conductive layer 24 of the first insulating substrate 20 or the second inner conductive layer 34 of the second insulating substrate 30 for the connection.

Figure 1:
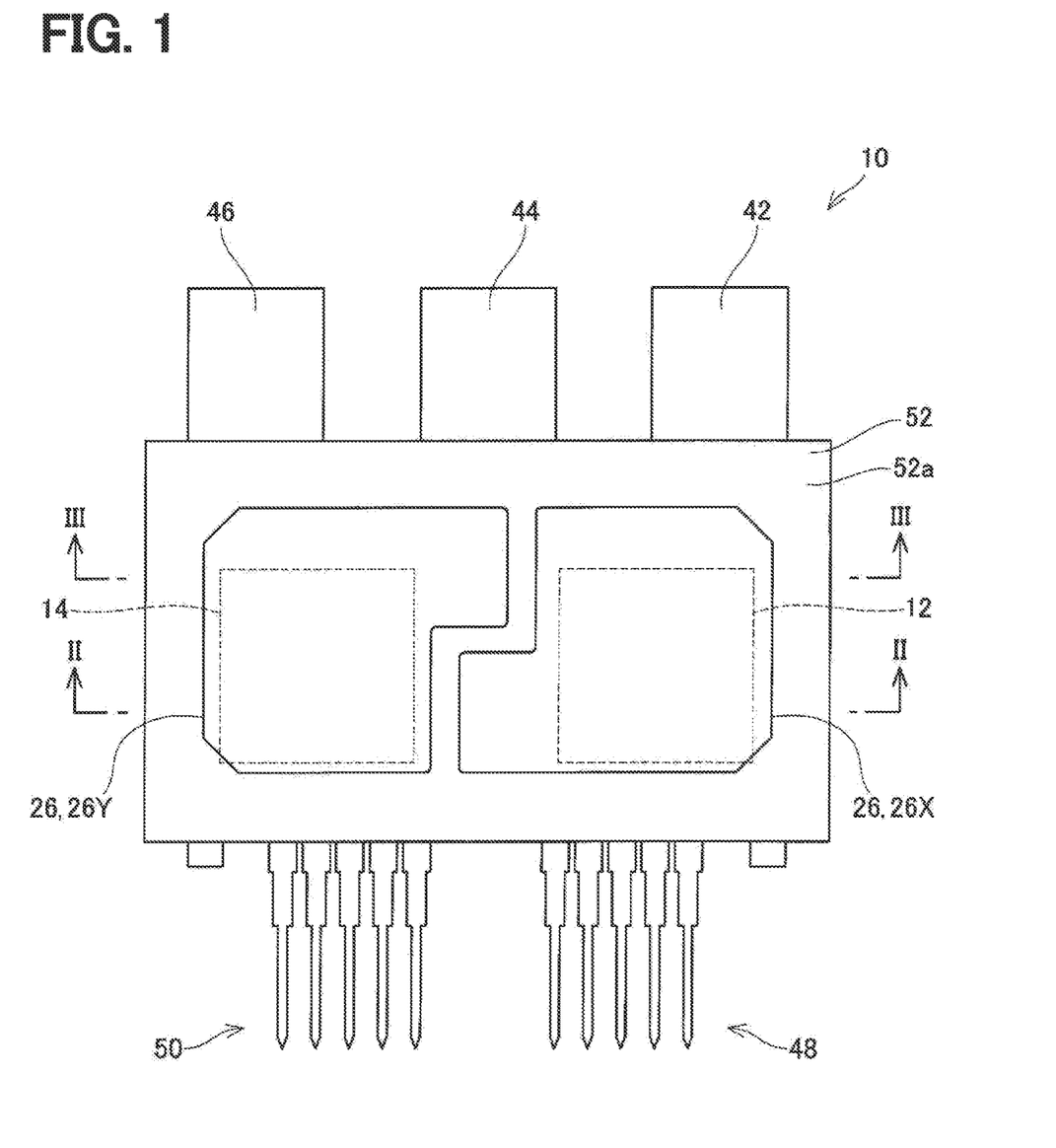
FIG. 1 is a plan view showing a semiconductor device according to an embodiment.
Figure 2:
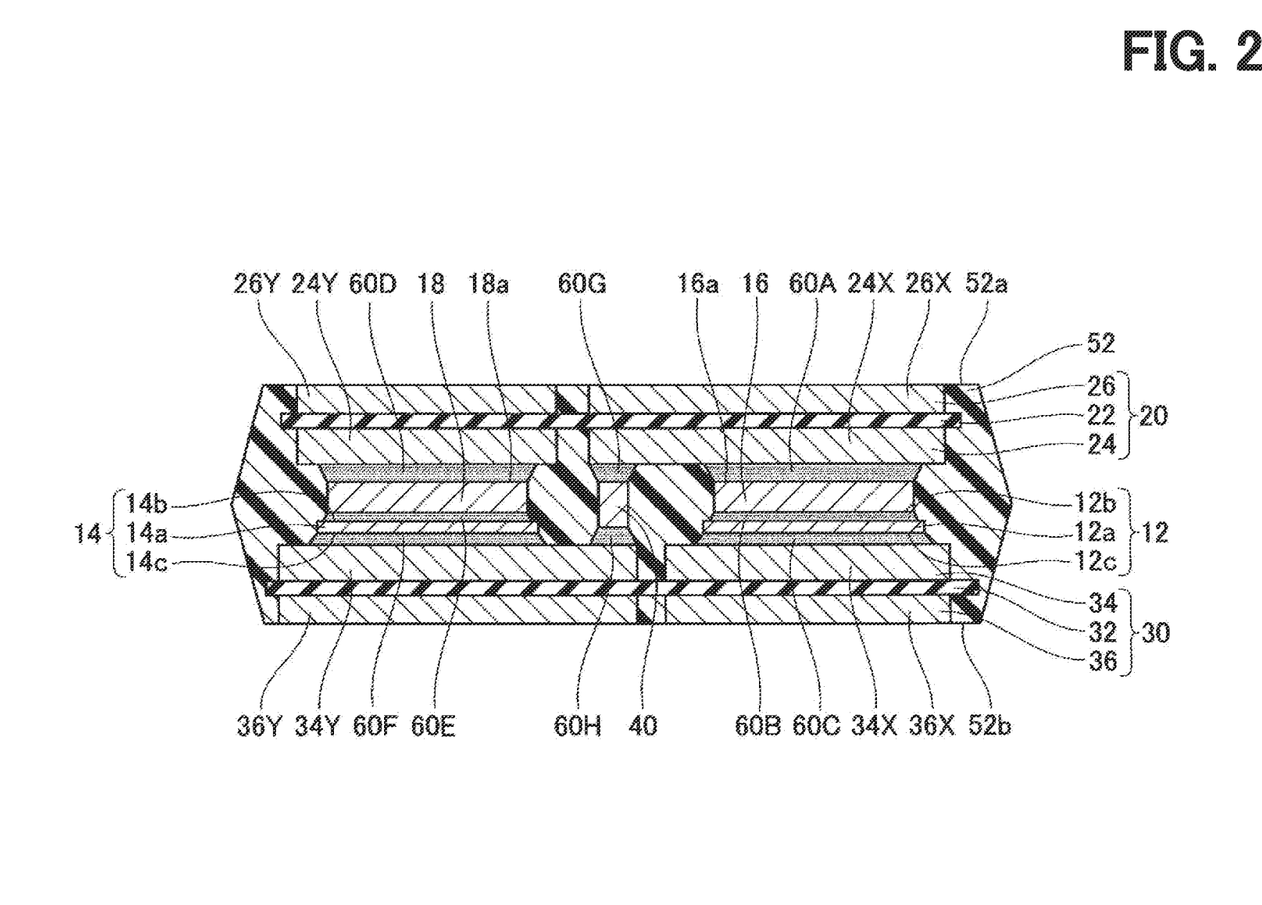
FIG. 2 is a cross-sectional view taken along the line II-II in FIG. 1.
Figure 3:
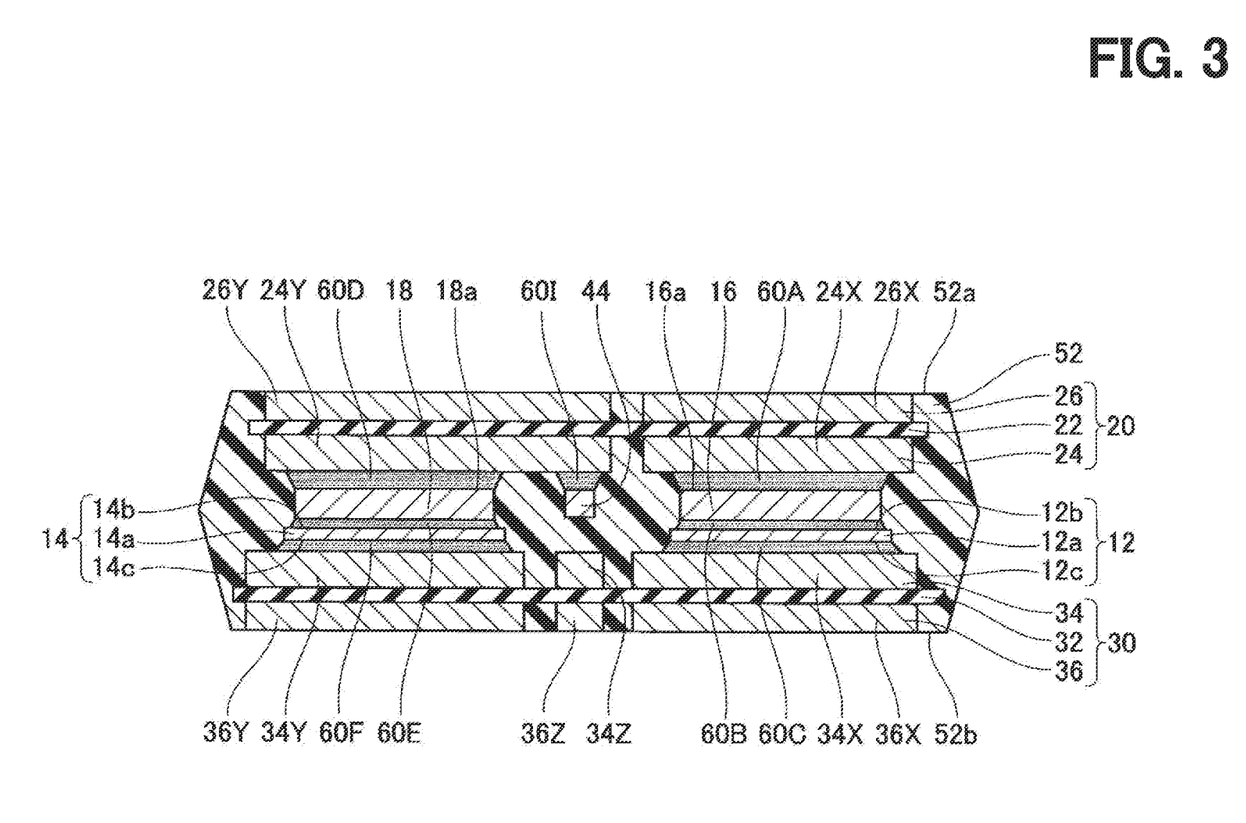
FIG. 3 is a cross-sectional view taken along the line III-III in FIG. 1.
Figure 4:
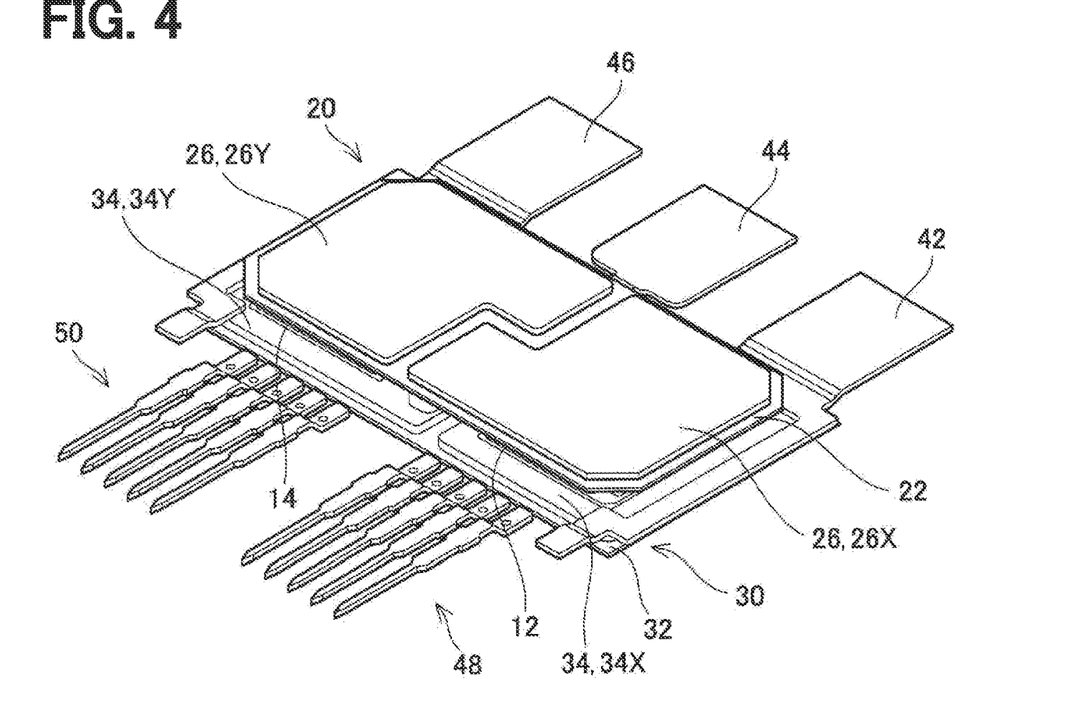
FIG. 4 is a perspective view showing an internal structure of the semiconductor device by omitting a sealer.
Figure 5:
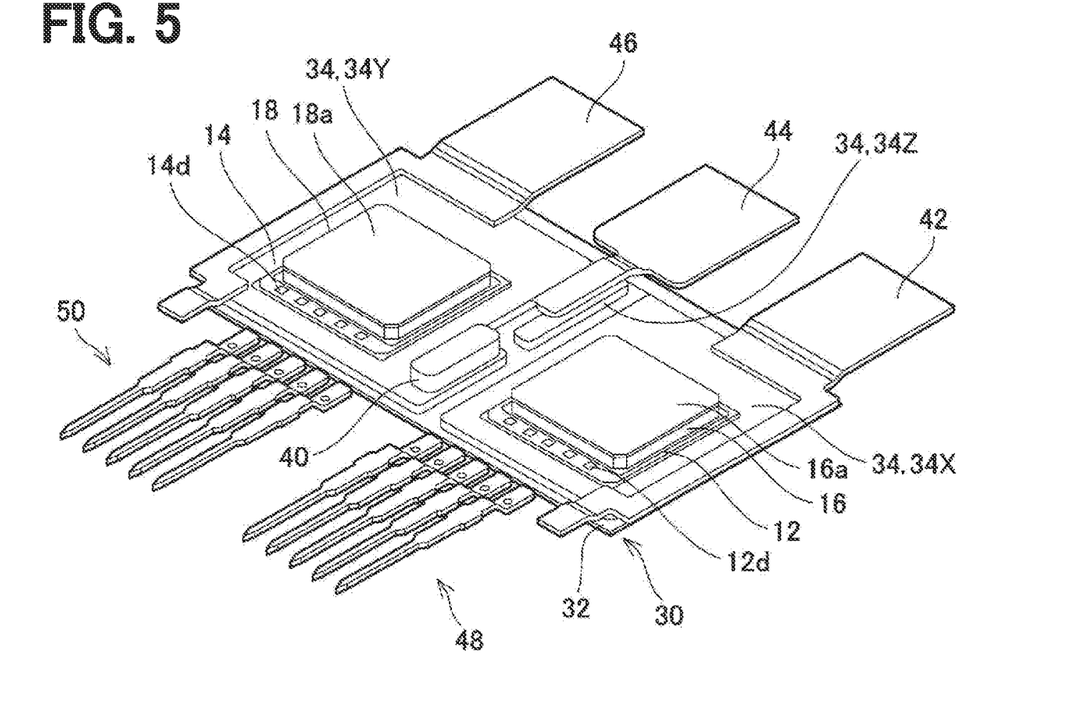
FIG. 5 is a perspective view showing the internal structure of the semiconductor device by omitting the sealer and a first insulating substrate.
Figure 6:
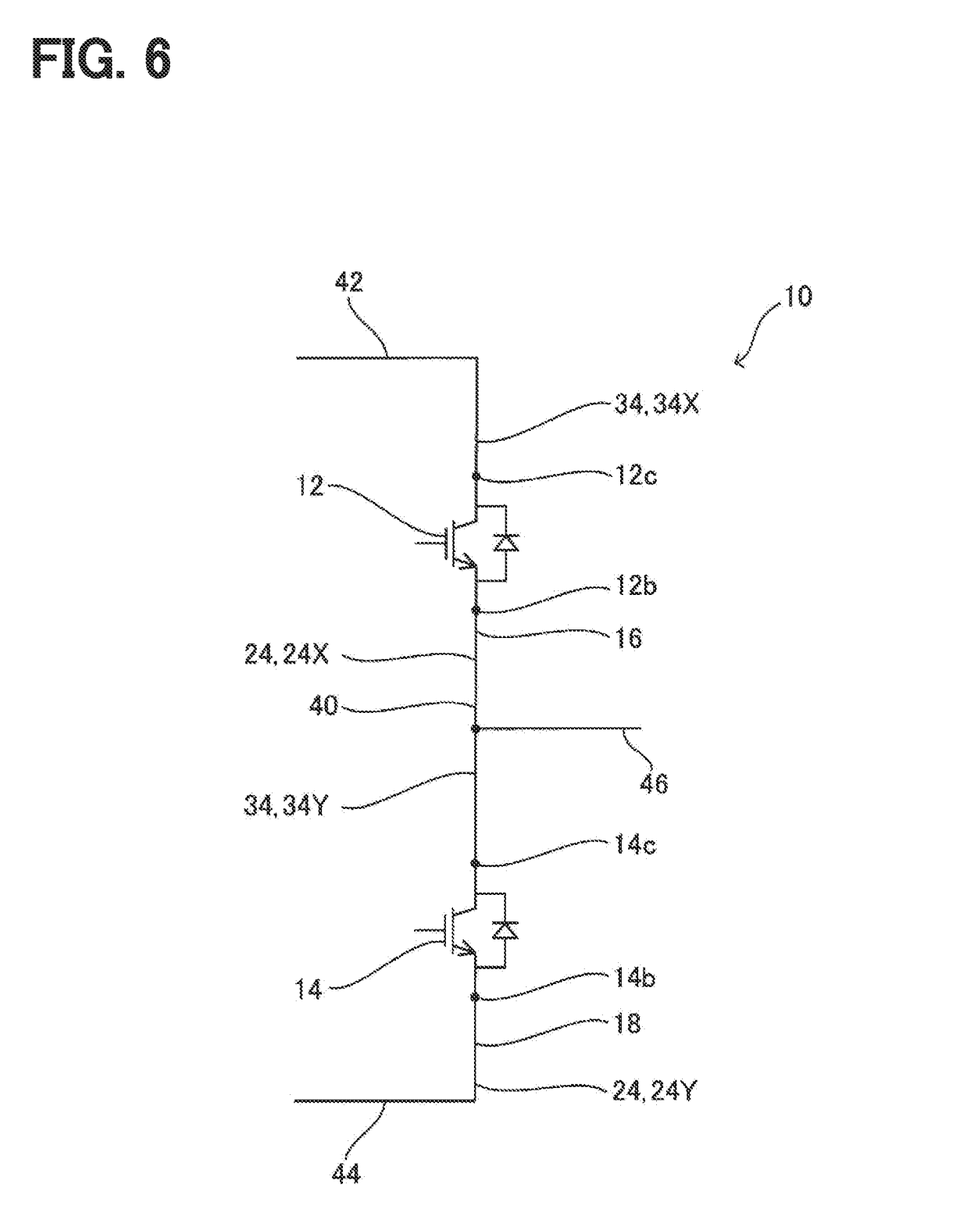
FIG. 6 is a circuitry diagram of the semiconductor device.
Figure 7:
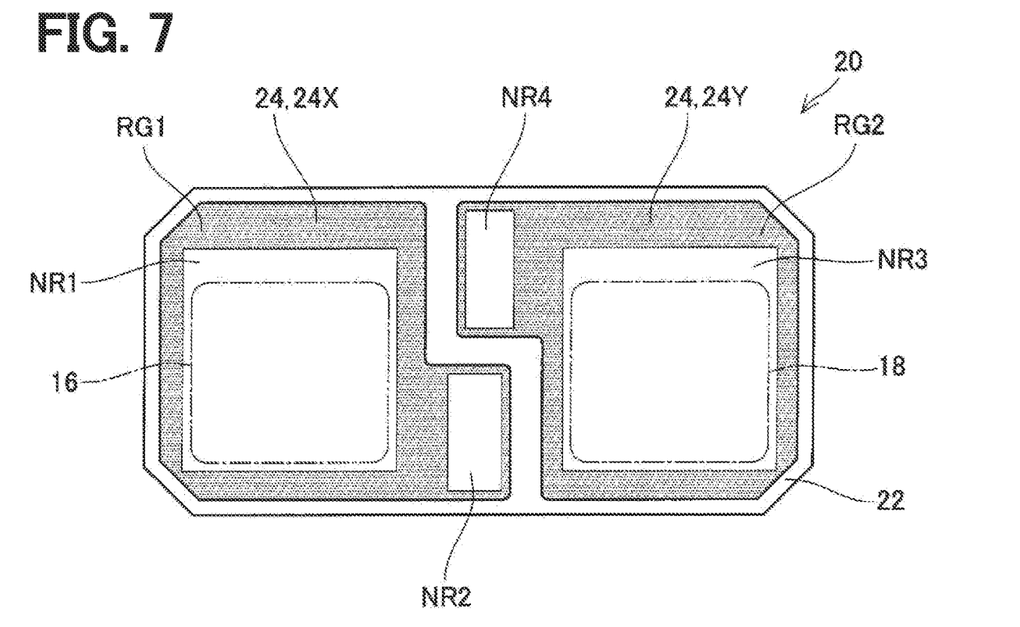
FIG. 7 illustrates a first inner conductive layer of the first insulating substrate.
Figure 8:
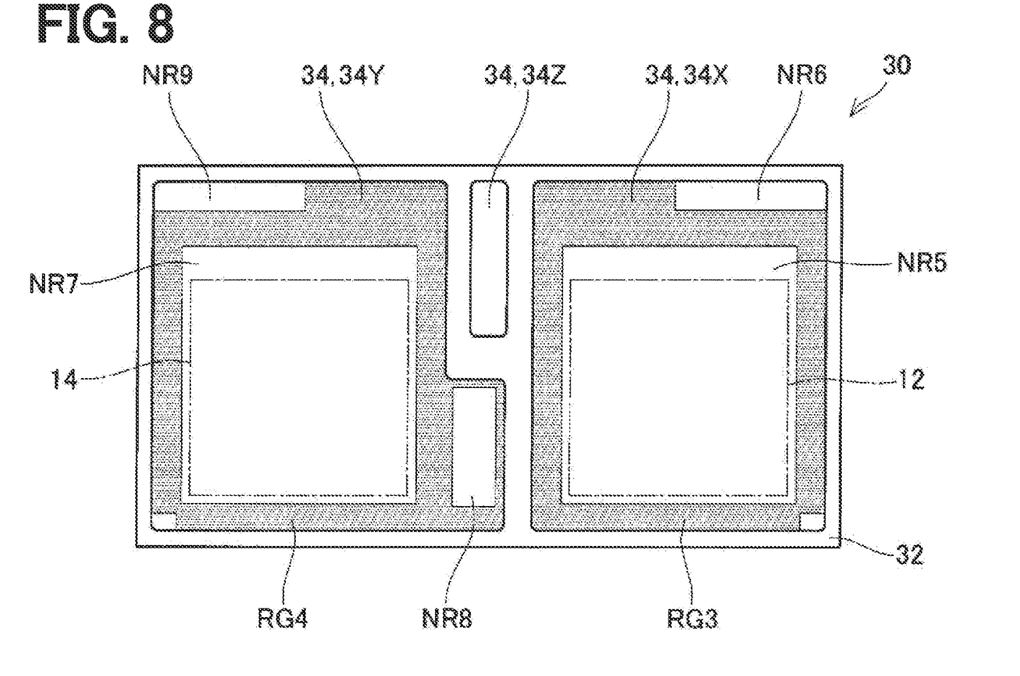
FIG. 8 illustrates a second inner conductive layer of a second insulating substrate.

The following describes the configuration of the first inner conductive layer 24 of the first insulating substrate 20 and the configuration of the second inner conductive layer 34 of the second insulating substrate 30 with reference to FIGS. 7, 8. As illustrated in FIG. 7, in the first insulating substrate 20, the surface of the first inner conductive layer 24 is partially roughened. As a result, non-roughened regions NR1, NR2 and a roughened region RG1 are formed at the first portion 24X of the first inner conductive layer 24. The roughened region RG1 surrounds the non-roughened regions NR1, NR2. The roughened region RG1 is a region roughened by, for example, laser irradiation, and the surface roughness of the roughened region RG1, RG2 is larger than the surface roughness of the non-roughened regions NR1, NR2. The first conductive spacer 16 is joined to the non-roughened region NR1 through the junction layer 60A, and the connecting member 40 is joined to the non-roughened region NR2 through the junction layer 60G. Non-roughened regions NR3, NR4 and the roughened region RG2 are formed at the second portion 24Y of the first inner conductive layer 24. The roughened region RG2 surrounds the non-roughened regions NR3, NR4. The second conductive spacer 18 is joined to the non-roughened region NR3 through the junction layer 60D, and the second power terminal 44 is joined to the non-roughened region NR4 through the junction layer 60I.

As illustrated in FIG. 8, the surface of the second inner conductive layer 34 is partially roughened at the second insulating substrate 30. As a result, non-roughened regions NR5, NR6 and a roughened region RG1 are formed at the first portion 34X of the second inner conductive layer 34. The roughened region RG3 surrounds the non-roughened regions NR5, NR6. The first semiconductor element 12 is joined to the non-roughened region NR5 through the junction layer 60C, and the first power terminal 42 is joined to the non-roughened region NR6 through the junction layer (not shown). Non-roughened regions NR7, NR8, NR9 and a roughened region RG4 are formed at the second portion 34Y of the second inner conductive layer 34. The roughened region RG4 surrounds the non-roughened regions NR7, NR8, NR9. The second semiconductor element 14 is joined to the non-roughened region NR7 through a junction layer 60F. The connecting member 40 is joined to another non-roughened region NR8 through a junction layer 60H. The third power terminal 46 is joined to another non-roughened region NR9 through a junction layer (not shown).

As described above, in the semiconductor device 10 of the present embodiment, the non-roughened region NR1 and the roughened region RG1 are disposed at, for example, the surface of the first inner conductive layer 24 of the first insulating substrate 20. The non-roughened region NR1 corresponds to a first region, and the roughened region RG1 corresponds to a second region. The non-roughened region NR1 is surrounded by the roughened region RA1. The non-roughened region NR1 having relatively small surface roughness has relatively high wettability for the molten joint material. In contrast, the roughened region RG1 having relatively large surface roughness has relatively low wettability for the molten joint material. Therefore, when the first conductive spacer 16 is joined to the non-roughened region NR1 by adopting the joint material such as solder material, the molten joint material is satisfactorily wetted and spread in the non-roughened region NR1, and is inhibited to be wet and spread to the roughened region RG1. Therefore, by appropriately designing the boundary between the non-roughened region NR1 and the roughened region RG1, it is possible to intendedly control the spread of wetting of the joint material in the first inner conductive layer 24.

In the semiconductor device 10 in the present embodiment, the area of the non-roughened region NR1 of the first portion 24X of the first inner conductive layer 24 is larger than the area of the upper surface 16a facing the non-roughened region NR1 of the first conductive spacer 16.

According to such a configuration, the junction layer 60A between the first inner conductive layer 24 and the first conductive spacer 16 can be in contact with the non-roughened region NR1 of the first inner conductive layer 24 over a sufficient area. In the following, the junction layer 60A is referred to as a first junction layer 60A. As a result, the first conductive spacer 16 and the first inner conductive layer 24 are firmly joined to each other. In particular, in the formation of the roughened region RG1, foreign substances scattered from the roughened region RG1 are adhered to the non-roughened region NR1. Even in such a case, when the non-roughened region NR1 is set to be wider than the size of the first conductive spacer 16, it is possible to suppress a decrease in a joining force caused by the foreign substances.

With the above configuration, in the semiconductor device 10 according to the present embodiment, the area where the first junction layer 60A is in contact with the first inner conductive layer 24 is larger than the area where the first junction layer 60A is in contact with the upper surface 16a of the first conductive spacer 16. As a result, the first junction layer 60A has a suitable fillet shape, and the thermal stress generated inside the semiconductor device 10, in particular, the junction layer 60A or its surrounding is suppressed. The first junction layer 60A extends over the entire non-roughened region NR1 at the surface of the first inner conductive layer 24. However, it is not limited to the above example. The first junction layer 60A may only reach at least a part of the boundary between the non-roughened region NR1 and the roughened region RG1 at the surface of the first inner conductive layer 24. In the embodiment, the first junction layer 60A may extend to the roughened region RG1 at the surface of the first inner conductive layer 24, and may not be needed to extend to the roughened region RG1. That is, the roughened region RG1 may completely inhibit the spread of wetting of the molten joint material, and may merely suppress the spread of wetting of the molten joint material.

As can be understood from FIG. 7, the margin as dimensional difference of the non-roughened region NR1 with respect to the first conductive spacer 16 may be partially increased. In this case, although it is not particularly limited, in the portion where the distance from the first conductive spacer 16 to the outer peripheral edge of the first inner conductive layer 24 is relatively large, the margin of the non-roughened region NR1 with respect to the first conductive spacer 16 may be increased. In other words, in the portion where the distance from the first conductive spacer 16 to the outer peripheral edge of the first inner conductive layer 24 is relatively small, the margin of the non-roughened region NR1 with respect to the first conductive spacer 16 may be decreased. As a result, the roughened region RG1 can be formed with a sufficient width outside the non-roughened region NR1, even in the portion where the distance is small.

In the semiconductor device 10 according to the present embodiment, each of the junction layers 60A to 60I may be made of solder material. However, the material included in each of the junction layers 60A to 60I is not only limited to the solder material, but may also be other joint material having conductivity. Regardless of the type of the joint material, the surface roughness required for the roughened regions RG1 to RG4 may be designed such that the spread of wetting of the molten joint material is suppressed. Further, the technique for forming the roughened region RG1 to RG4 is not limited to laser irradiation, and may be, for example, electron beam irradiation, sputtering, chemical etching, or shot blasting.

The functional effects related to the non-roughened region NR1 described above are similar to the effects exhibited in each of other non-roughened region NR2 to NR 9. For example, in the second portion 24Y of the first inner conductive layer 24, when the second conductive spacer 18 is joined to the non-roughened region NR2, the molten joint material is satisfactorily wetted and spread in the non-roughened region NR2, and is inhibited to be wet and spread to the roughened region RG2. The non-roughened region NR2 corresponds to a fifth region, and the roughened region RG2 corresponds to a sixth region. In the first portion 24Y of the second inner conductive layer 34, when the first semiconductor element 12 is joined to the non-roughened region NR5, the molten joint material is satisfactorily wetted and spread in the non-roughened region NR5, and is inhibited to be wet and spread to the roughened region RG3. The non-roughened region NR5 corresponds to a third region, and the roughened region RG3 corresponds to a fourth region. In the second portion 24Y of the second inner conductive layer 34, when the second semiconductor element 14 is joined to the non-roughened region NR7, the molten joint material is satisfactorily wetted and spread in the non-roughened region NR7, and is inhibited to be wet and spread to the roughened region RG4. The non-roughened region NR7 corresponds to a seventh region, and the roughened region RG4 corresponds to an eighth region. When the corresponding connecting member 40 or the power terminals 42, 44, 46 are joined to each of the remaining non-roughened region NR2, NR4, NR6, NR8, NR9, the excessive spread of wetting of the molten joint material can be suppressed by the roughened regions RG1 to RG4.

The remaining non-roughened regions NR2, NR4, NR6, NR8, NR9 are located in the vicinity of the outer peripheral edge of each of the first inner conductive layer 24 and the second inner conductive layer 34. A part of each of the non-roughened regions NR2, NR4, NR6, NR8, NR9 reaches the outer peripheral edge of corresponding one of the first inner conductive layer 24 and the second inner conductive layer 34 at a position, which may not have to be surrounded by the roughened regions NG1 to NG4. Even with such a configuration, the spread of wetting of the molten solder material may be prevented by the edge of the outer periphery of each of the first inner conductive layer 24 and the second inner conductive layer 34. However, in such an embodiment, it is also effective to suppress the wettability at the side surface of each of the first inner conductivity layer 24 and the second inner conductivity layer 34 by omitting the gold plating of the first inner conductivity layer 24 and the second inner conductivity layer 34. The side surface of each of the first inner conductivity layer 24 and the second inner conductivity layer 34 corresponds to an outer peripheral surface.

Although specific examples of the techniques disclosed in the present specification have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the description at the time of filing. The techniques illustrated in the present specification or drawings can achieve multiple objectives at the same time, and achieving one of the objectives itself has technical usefulness.

What is claimed is:

1. A semiconductor device comprising:
    a first insulating substrate; and
    a first semiconductor element configured to be joined to the first insulating substrate through a first conductive spacer;
    wherein the first insulating substrate includes a first insulating layer and a first inner conductive layer disposed at a side of the first insulating layer,
    wherein the first inner conductive layer includes a surface having a first region and a second region, and the second region surrounds the first region and has larger surface roughness than the first region,
    wherein the first conductive spacer is joined to the first region of the first inner conductive layer through a first junction layer,
    wherein a margin of the first region with respect to the first conductive spacer is partially enlarged in a plan view of the first inner conductive layer, and
    wherein a distance between the first conductive spacer and a peripheral edge of the first inner conductive layer is larger in a portion where the margin is larger as compared with another portion where the margin is smaller.

2. The semiconductor device according to claim 1,
    wherein an area of the first region of the first inner conductive layer is larger than an area of a surface of the first conductive spacer facing the first region.

3. The semiconductor device according to claim 2,
    wherein an area where the first junction layer is in contact with the first inner conductive layer is larger than an area where the first junction layer is in contact with the surface of the first conductive spacer.

4. The semiconductor device according to claim 1,
    wherein the first junction layer reaches at least one portion of a boundary between the first region and the second region at the surface of the first inner conductive layer.

5. The semiconductor device according to claim 4,
    wherein the first junction layer entirely covers the first region at the surface of the first inner conductive layer.

6. The semiconductor device according to claim 1,
    wherein the first junction layer does not cover the second region at the surface of the first inner conductive layer.

7. The semiconductor device according to claim 1,
    wherein the first junction layer is made of solder material.

8. The semiconductor device according to claim 1,
    wherein the first insulating substrate further includes a first outer conductive layer disposed at another side of the first insulating layer.

9. The semiconductor device according to claim 1, further comprising:
    a sealer configured to seal the first semiconductor element,
    wherein the sealer is in contact with the second region of the first inner conductive layer.

10. The semiconductor device according to claim 1,
    wherein the second region of the first inner conductive layer is a region roughened by at least one of laser irradiation, electron beam irradiation, sputtering, chemical etching and short blasting.

11. The semiconductor device according to claim 1, further comprising:
    a second insulating substrate facing the first insulating substrate, with the first semiconductor element interposed between the second insulating substrate and the first insulating substrate,
    wherein the second insulating substrate includes a second insulating layer and a second inner conductive layer disposed at a side of the second insulating layer,
    wherein the second inner conductive layer includes a surface having a third region and a fourth region, and the fourth region surrounds the third region and has larger surface roughness than the third region, and
    wherein the first semiconductor element is joined to the third region of the second inner conductive layer through a second junction layer.

12. The semiconductor device according to claim 11,
    wherein the second insulating substrate further includes a second outer conductive layer disposed at another side of the second insulating layer.

13. The semiconductor device according to claim 1, further comprising:
    a second semiconductor element configured to be joined to the first insulating substrate through the second conductive spacer,
    wherein the first inner conductive layer of the first insulating substrate includes a fifth region and a sixth region, and the sixth region surrounds the fifth region and has larger surface roughness than the fifth region, and
    wherein the second conductive spacer is joined to the fifth region of the first inner conductive layer through a third junction layer.

14. The semiconductor device according to claim 13,
    wherein the first inner conductive layer of the first insulating substrate includes a first portion and a second portion separated from each other above the first insulating layer,
    wherein the first region and the second region are located at the first portion of the first inner conductive layer, and
    wherein the fifth region and the sixth region are located at the second portion of the first inner conductive layer.

15. The semiconductor device according to claim 13, further comprising:
    a second insulating substrate facing the first insulating substrate, with the second semiconductor element interposed between the first insulating substrate and the second insulating substrate,
    wherein the second insulating substrate includes a second insulating layer and a second inner conductive layer disposed at a side of the second insulating layer,
    wherein the second inner conductive layer includes a surface having a seventh region and an eighth region, and the eighth region surrounds the seventh region and has larger surface roughness than the seventh region, and
    wherein the second semiconductor element is joined to the seventh region of the second inner conductive layer through a fourth junction layer.

* * * * *